United States Patent [19]

Gollinger et al.

[11] 4,302,690

[45] Nov. 24, 1981

[54] CMOS CIRCUIT FOR CONVERTING A TERNARY SIGNAL INTO TWO BINARY SIGNALS, AND USE OF THIS CMOS CIRCUIT

[75] Inventors: Wolfgang Gollinger, Gundelfingen; Joachim Grosse, March-Buchheim; Arnold Uhlenhoff, Glottertal, all of Fed. Rep. of Germany

[73] Assignee: ITT Industries, Inc., New York, N.Y.

[21] Appl. No.: 66,265

[22] Filed: Aug. 13, 1979

[30] Foreign Application Priority Data

Sep. 14, 1978 [DE] Fed. Rep. of Germany ....... 2840006

[51] Int. Cl.$^3$ .......................................... H03K 19/094
[52] U.S. Cl. .................................... 307/451; 307/360; 307/473
[58] Field of Search .............. 307/205, 209, 214, 360, 307/361, 279, 288, 304

[56] References Cited

U.S. PATENT DOCUMENTS 3,969,633  7/1976  Paluck et al. ...................... 307/205

FOREIGN PATENT DOCUMENTS 2704094  8/1977  Fed. Rep. of Germany ...... 307/209

*Primary Examiner*—Eugene R. LaRoche
*Attorney, Agent, or Firm*—John T. O'Halloran; Peter C. Van Der Sluys

[57] ABSTRACT

The ternary-binary conversion is reached by two CMOS inverters dimensioned extremely unsymmetrically with regard to their W/L ratio and connected in parallel at their inputs. By further addition of a NAND or a NOR gate the circuit can be used in an integrated circuit as option releasing stage without additional terminal for the option signal which has only to be chosen as the middle value of the ternary signal whereas its lower and upper values are the binary signals.

12 Claims, 4 Drawing Figures

| FIG. 2 | | | | | FIG. 3 | | | | |
|---|---|---|---|---|---|---|---|---|---|
| E | A1 | A2 | A3 | A4 | E | A1 | A2 | A3 | A5 |
| L | H | H | L | L | L | H | H | L | H |
| H | L | L | H | L | H | L | L | H | H |
| Z | H | L | L | H | Z | L | H | H | L |
| $S_T = H, Z, L$ | | | | | $S_B = H, L$ | | | | |
| $H \approx U_B$ | | $Z \approx \frac{1}{2} U_B$ | | | $L \approx 0$ | | | | |

4,302,690

CMOS CIRCUIT FOR CONVERTING A TERNARY SIGNAL INTO TWO BINARY SIGNALS, AND USE OF THIS CMOS CIRCUIT

BACKGROUND OF THE INVENTION

1. Field of the Invention

This invention relates to logic circuits and particularly to such circuits employing CMOS components for converting a three-state digital signal into two two-state digital signals.

2. Description of the Prior Art

Monolithic integrated, complementary insulated-gate field-effect transistor technology, i.e., so-called CMOS technology, is described, for example, in the journal "The Electronic Engineer", May 1970, pp. 52 to 57. The basic building block of a CMOS circuit is the so-called CMOS inverter, i.e., a series combination of N-channel and P-channel transistors whose gates are interconnected and serve as the input to the inverter, whose output is the junction of the drain electrodes of the N-channel and P-channel transistors. The source electrode of the N-channel transistor is grounded, and that of the P-channel transistor is connected to a positive dc supply voltage. Both transistors are of the enchancement mode.

In the above reference, such circuits are called "complementary-symmetry MOS circuits", which indicates that the physical dimensions of the P-channel and N-channel transistors are such that, in the "on" state of the respective transistor, the resistance of the controlled current path is equal in both transistors. A measure of this on-resistance is the ratio of the channel width W to the channel length L, i.e., the so-called W/L ratio. To achieve the above-mentioned equality of the on-resistances of the two complementary transistors, for physical reasons the W/L ratio of the P-channel transistor must be about 1.5 times that of the associated N-channel transistor. In a low-resistance transistor, the W/L ratio must be large compared to unity.

Conventional CMOS circuits are particularly suitable for digital circuits which process binary signals, i.e., signals having two possible states. One state has a value which is virtually equal to the supply voltage level and is therefore designated "H", while the other has a value which virtually corresponds to ground potential and is therefore designated "L". Thus, if one of these two states is presented to the input of a CMOS inverter, the signal at the output of the inverter will change to the respective other state. In the case of symmetrical CMOS inverters, this change of state takes place when the input voltage is traversing the range of about one half the H-state voltage.

OBJECT

If such binary-signal-processing digital circuits also are to process a ternary signal, i.e., a digital signal having three possible states, such a ternary signal, which is generally applied via an input line, must be converted into two digital signals applied at the same time, usually at two points of the circuit or at two lines. It is, therefore, the object of the invention defined in the claims to provide a CMOS circuit capable of performing such a conversion of ternary signals into corresponding digital signals. Another object of the invention is to define a preferred use of the circuit which is particularly advantageous in integrated circuits having a limited number of external terminals.

DESCRIPTION OF THE DRAWINGS

The invention will now be explained in more detail with reference to the accompanying drawings, in which.

DESCRIPTION OF THE PREFERRED EMBODIMENT

Figure 1:
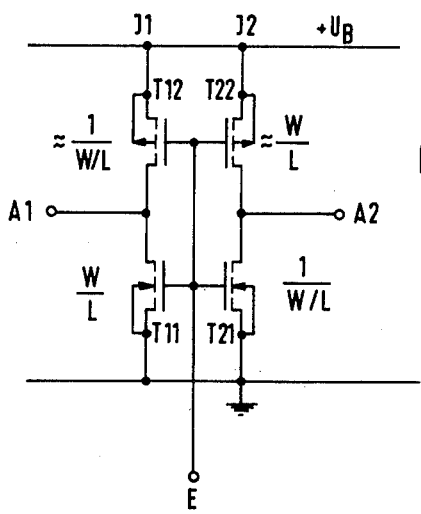
FIG. 1 is a schematic circuit diagram of a preferred embodiment of the circuit arrangement according to the invention.

Referring to FIG. 1, the diagram of the CMOS circuit according to the invention shows two CMOS inverters I1, I2, whose N-channel transistors T11, T21 and P-channel transistors T12, T22 are connected together as described above, and whose inputs are coupled together and connected to the ternary-signal input E. According to the invention, on the one hand, each of the two CMOS inverters is highly unsymmetrical with respect to its W/L ratio, and on the other hand, this asymmetry is "crossed" with regard to the two CMOS inverters; in the most general case, all four transistors have different W/L ratios. In the preferred embodiment shown in FIG. 1, the N-channel transistor T11 of the first CMOS inverter I1 and the P-channel transistor T22 of the second CMOS inverter I2 have W/L ratios giving the same on-resistance, while the N-channel transistor T21 of the second CMOS inverter I2 and the P-channel transistor T12 of the first CMOS inverter T1 have approximately reciprocal W/L ratios in relation thereto.

The junction of the drains of the first CMOS inverter I1 is designated by "output A1", and the corresponding junction of the second CMOS inverter I2 by "output A2". The two CMOS inverters I1, I2 have their respective main current paths connected between ground and the positive terminal + of the supply-voltage source $U_B$.

Figure 2:
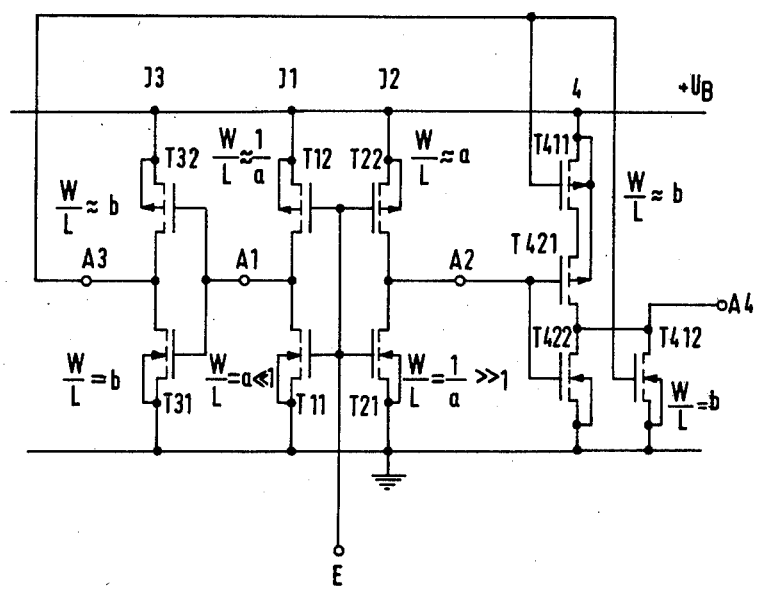
FIG. 2 shows a preferred embodiment of the invention if a separate output of the circuit is to provide a binary signal whose H state occurs only when the middle state of the ternary signal is applied at the input of the circuit.
Figures 3, 4:
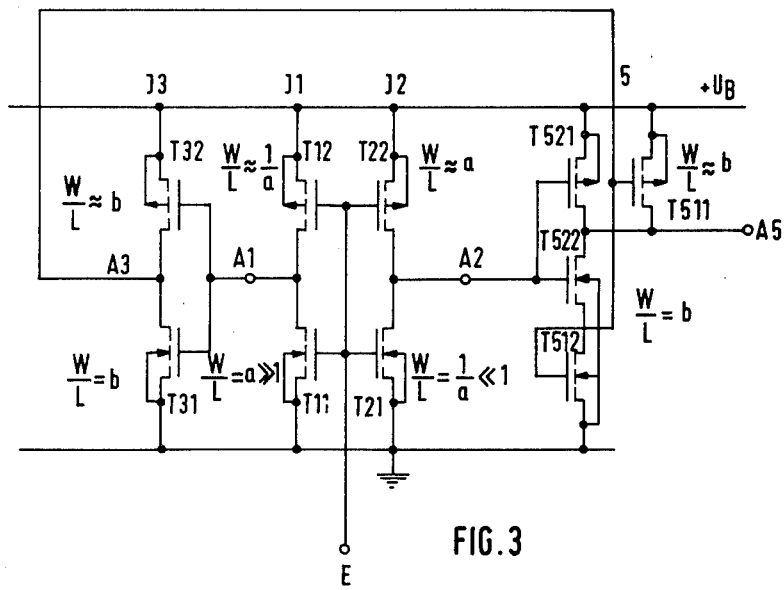
FIG. 3 shows another preferred embodiment, corresponding to the arrangement of FIG. 2, if a separate output of the circuit is to provide a binary signal whose L state occurs only when the middle state of the ternary signal is applied at the input of the circuit.
FIG. 4 is a table showing the relationships between the ternary- and binary-signal states occurring at the inputs and outputs of the preferred embodiments of FIGS. 2 and 3.

In the Table of FIG. 4, the entries concerning FIG. 2 show the binary-signal states appearing at the outputs A1, A2 when a ternary signal $S_T$ is applied to the ternary-signal input E. The three states of the ternary signal are designated H, Z, L and correspond to voltage values given in the bottom line of the Table of FIG. 4. The states H and L correspond to the H and L states of the binary signals $S_B$, while the middle state Z corresponds to about half the supply-voltage level $U_B$. The data on FIG. 2 presupposes that the N-channel transistor T11 of the first CMOS inverter I1 has a high on-resistance.

Thus, with the above-defined operation of the two CMOS inverters I1, I2, an L state at the ternary-signal input E will cause an H state to appear at both the output A1 and the output A2. With an H state applied at the ternary-signal input E, both outputs A1, A2 will be in the L state, which is again in accordance with the above-defined inverter function. If, however, the Z state is applied at the ternary-signal input E, an H state will result at the output A1, since, as assumed hereinabove, the N-channel transistor T11 of the first CMOS inverter I1 has a high on-resistance. This, together with the highly unsymmetrical design (the P-channel transistor T12 thus has a low on-resistance), causes the aforementioned change of state to take place at a voltage below the Z-state voltage.

From the assumed high on-resistance of the N-channel transistor T11 it also follows that the N-channel transistor T21 of the second CMOS inverter has a low on-resistance, while the P-channel transistor T22 has a high on-resistance, so that the change-of-state range lies above the Z-state voltage, i.e., a Z state at the ternary-signal input E will result in an L state at the output A2. The binary signals $S_B$ appearing at the outputs A1, A2 are thus in the states H, H for the ternary-signal state L, in the states L, L for the ternary-signal state H, and in the states H, L for the ternary-signal state Z. Thus, these combinations of states are unambiguously assigned to the three ternary states.

The data on FIG. 3 in the Table of FIG. 4 presupposes that not the N-channel transistor T11 of the first CMOS inverter I1 but the N-channel transistor T21 of the second CMOS inverter I2 has a high on-resistance. It can be seen that if a Z state is applied at the ternary-signal input E, the last-mentioned signal combination at the outputs A1, A2 is reversed in this case, since the second CMOS inverter I2 now changes state at a voltage below the Z-state voltage.

FIG. 2 shows a further development of the invention if an additional output is to provide a binary signal whose H state is to occur only when the middle state Z is statically applied at the ternary-signal input E. The improvement over FIG. 1 consists in the fact that, on the one hand, the CMOS inverter I3, which is symmetrical with respect to the W/L ratios of its transistors, follows the output A1 of the first CMOS inverter, and that, on the other hand, the output A2 of the second CMOS inverter I2 is followed by a NOR gate 4. Since the NOR gate has to process only binary signals, it is, as usual, symmetrical with respect to the W/L ratios of its transistors, too. The symmetrical design is indicated in FIG. 2 by the W/L ratio b, while the highly unsymmetrical design of the first and second CMOS inverters is indicated by the W/L ratio a, which, in the specific embodiment of FIG. 2, is assumed to be small compared to unity, so that the N-channel transistor T11 of the first CMOS inverter I1 has a high on-resistance.

The circuit of the NOR gate 4 corresponds to that of the NOR gate shown in FIG. 7 on page 54 of the above-mentioned reference, the four inputs having been reduced to two. It consists of the N-channel transistors T412, T422 and the P-channel transistors T411, T421. The interconnected gates of the transistors T411, T412 represent the first input of the NOR gate 4, which input is connected to the output A3 of the symmetrical CMOS inverter I3, while the interconnected gates of the transistors T421, T422 represent the second input of the NOR gate 4, which input is connected to the output A2 of the second CMOS inverter I2. The output A4 of the NOR gate 4 is formed by the interconnected drain electrodes of the transistors T412, T421, T422.

The signal states at the four outputs A1, A2, A3, A4 are listed in the Table of FIG. 4 under the entries of FIG. 2, these entries being valid if the on-resistance of the N-channel transistor T11 is high. Thus, if the ternary-signal input E is in the H state, the output A3 is in the H state, too, while ternary-signal states L and Z result in an L state at the output A3. Consequently, the output A4 is in the H state only if a Z state is statically applied at the ternary-signal input E.

Since the ternary signal $S_T$ sweeps over the state Z whenever it changes between its two states H, L, it might be expected that the H state also appears briefly at the output A4. However, this is prevented by the switching delays in such circuits, it being possible to deliberately introduce such delays if required.

The preferred embodiment shown in FIG. 3 corresponds largely to that of FIG. 2, but with the fundamental difference that the N-channel transistor T11 of the first CMOS inverter I1 now has a low on-resistance, which is achieved by making the W/L ratio a large compared to unity. The embodiment of FIG. 3, too, includes the symmetrical CMOS inverter I3, which is coupled to the output A1 of the first CMOS inverter I1. Unlike in the arrangement of FIG. 2, the second CMOS inverter I2 is followed by a NAND gate 5, which is designed according to FIG. 8 on p. 54 of the above-mentioned reference, the number of inputs having been reduced from four to two.

The NAND gate 5 consists of the transistors T511, T512, T521, T522, the interconnected gates of the transistors T511, T512 representing its first input, which is connected to the output A3 of the symmetrical CMOS inverter I3, and the interconnected gates of the transistors T521, T522 forming the gate's second input, which is connected to the output A2 of the second CMOS inverter I2. The output A5 of the NAND gate 5, which output is identical with the junction of the drain electrodes of the transistors T511, T521, T522, produces an L signal only when the middle state Z of the ternary signal $S_T$ is statically applied at the ternary-signal input E. The states of the individual output signals A1, A2, A3, A5 are again listed in the Table of FIG. 4 under the entries of FIG. 3.

A preferred use of the invention is in those integrated circuits where the size of the case limits the number of external terminals so that one of these terminals must serve a dual purpose. In this case, the embodiment of FIGS. 2 or 3 can be used as a subcircuit of such an integrated circuit, the dual-purpose terminal being the ternary-signal input E. Through this terminal, the highest state H and the lowest state L of the ternary signal $S_T$ are fed as the two states H, L of a binary signal $S_B$ into the circuit, where they can be obtained from the outputs A1,A2 of the two CMOS inverters I1, I2. If the middle state Z is applied at the ternary-signal input E, the signal at the output A4 of A5 of the arrangement of FIGS. 2 or 3 is used to initiate a switching signal within the integrated circuit. Thus, a so-called option or, particularly advantageously, changeover during the testing of the integrated circuit is possible via the Z state of the ternary signal.

"Option" as used herein means that the integrated circuit permits the user to choose between two modes of operation with respect to one parameter. In one mode, he must apply the binary signals H, L through the dual-purpose input terminal, while the other mode is caused by the Z state at the input terminal.

When testing the circuit, the Z state causes a signal sequence which is different, preferably shorter, than that occurring during the intended operation. This shorter signal sequence is particularly advantageous if the integrated circuit contains large-capacity counters or frequency dividers with a large division ratio which divide a predetermined frequency so that the output period during the intended operation of the integrated circuit is one second or more, as is the case in integrated circuits for quartz-crystal watches. Such a long testing time is undesirable in the fabrication of integrated circuits. By the aforementioned switching signal, which is caused by the Z state at the ternary-signal input E, one or more stages of such counters or frequency dividers are, therefore, short-circuited or changed over so that the output frequency is considerably higher, and the measurement result need not be waited for so long. An example of such a changeover is described in connection with an integrated circuit for a quartz-crystal watch in German Offenlegungsschrift (DE-OS) No. 2363470 with reference to the portion E of FIG. 1.

It is self-evident that such changeovers during the testing of integrated circuits are not limited to integrated circuits for quartz-crystal watches, but can be used whenever the problem of a long measuring time must be solved by shortening or switching measurement cycles. In this connection, to produce the middle state Z of the ternary signal $S_T$ at the input E, it is particularly advantageous if the tap of a highly resistive voltage divider contained in the integrated circuit and connected across the supply voltage $U_B$ lies in about the middle of the total resistance value, and if the voltage obtained is permanently applied to the terminal for the input E. Thus, if this terminal is not wired, i.e. open, on the outside, the intended switching functions will be initiated by the state Z. If, however, a signal source, ground or the supply voltage $U_B$ are permanently connected to the external terminal, this terminal will serve as the usual binary-signal input. The signal source may only have a much lower resistance than the voltage divider. The voltage divider is advantageously implemented with suitably connected CMOS transistors.

What is claimed is:

1. A circuit arrangement using monolithic integrated, complementary insulated-gate field-effect transistor technology serving to convert a ternary digital signal having three possible states into two binary digital signals having two possible states, comprising:
    first and second CMOS inverters each being highly unsymmetrical with respect to the channel-width-to-length ratios;
    a ternary-signal input connected to the interconnected inputs of said first and second CMOS inverters;
    the N-channel transistor of the first CMOS inverter and the P-channel transistor of the second CMOS inverter have both either a small or a large W/L ratio, whereas the P-channel transistor of the first CMOS inverter and the N-channel transistor of the second CMOS inverter have both either a large or small W/L ratio and the output of said first and the output of the second CMOS inverter are the outputs for the two digital signals.

2. A circuit arrangement as claimed in claim 1, wherein:
    the N-channel transistor of the first CMOS inverter and the P-channel transistor of the second CMOS inverter have the same W/L ratio, whereas the P-channel transistor of the first CMOS inverter and the N-channel transistor of the second CMOS inverter have an approximately reciprocal W/L ratio with respect thereto.

3. A circuit arrangement as claimed in claims 1 or 2, wherein:
    the W/L ratio of the N-channel transistor of the first CMOS inverter is small compared to unity;
    the output of the first CMOS inverter is connected to the input of CMOS inverter which is symmetrical with respect to the W/L ratios of its two transistors; the output of the second CMOS inverter and the output of the symmetrical CMOS inverter are connected to the two inputs of an OR or a NOR gate whose output provides a signal whose highest state occurs only when the middle state of the ternary signal is statically applied at the ternary-signal input.

4. A circuit arrangement as claimed in claim 3 wherein the ternary-signal input is one of those external terminals of the integrated circuit that are required for the intended function and through which the highest and the lowest state of the ternary signal are entered as the two states of a binary signal to be processed, for initiating a switching signal within the integrated circuit when the middle state of the ternary signal is applied at the ternary-signal input.

5. A circuit as claimed in claim 4 wherein, to permanently apply the middle state of the ternary signal at the ternary-signal input, a highly resistive voltage divider included in the integrated circuit and connected across the supply voltage has its tap, located in about the middle of the total resistance value and is constantly connected to the ternary-signal input.

6. A circuit as claimed in claim 4, wherein, during the testing of the integrated circuit the switching signal causes a signal sequence which is different, preferably shorter, than that occurring during the intended operation.

7. A circuit as claimed in claim 6, wherein, to permanently apply the middle state of the ternary signal at the ternary-signal input, a highly resistive voltage divider included in the integrated circuit and connected across the supply voltage has its tap, located in about the middle of the total resistance value and is constantly connected to the ternary-signal input.

8. A circuit arrangement as claimed in claims 1 or 2, wherein:
    the W/L ratio of the N-channel transistor of the first CMOS inverter is large compared to unity;
    the output of the first CMOS inverter is connected to the input of a CMOS inverter which is symmetrical with respect to the W/L ratios of its two transistors;
    the output of the second CMOS inverter and the output of the symmetrical CMOS inverter are connected to the two inputs of an AND or a NAND gate whose output provides a signal whose lowest state occurs only when the middle state of the ternary signal is statically applied at the ternary signal input.

9. A circuit arrangement as claimed in claim 8 wherein the ternary-signal input is one of those external terminals of the integrated circuit that are required for the intended function and through which the highest and the lowest state of the ternary signal are entered as the two states of a binary signal to be processed, for initiating a switching signal within the integrated circuit when the middle state of the ternary signal is applied at the ternary-signal input.

10. A circuit as claimed in claim 9, wherein, to permanently apply the middle state of the ternary signal at the ternary-signal input, a highly resistive voltage divider included in the integrated circuit and connected across the supply voltage has its tap, located in about the middle of the total resistance value and is constantly connected to the ternary-signal input.

11. A circuit as claimed in claim 9, wherein, during the testing of the integrated circuit the switching signal causes a signal sequence which is different, preferably shorter than that occurring during the intended operation.

12. A circuit as claimed in claim 11 wherein, to permanently apply the middle state of the ternary signal at the ternary-signal input, a highly resistive voltage divider included in the integrated circuit and connected across the supply voltage has its tap, located in about the middle of the total resistance value and is constantly connected to the ternary-signal input.

* * * * *